(12) United States Patent
Kawasaki et al.

(10) Patent No.: US 6,956,427 B2
(45) Date of Patent: Oct. 18, 2005

(54) ELECTRICALLY INSULATED SWITCHING ELEMENT DRIVE CIRCUIT

(75) Inventors: Koji Kawasaki, Okazaki (JP); Tsuyoshi Yamashita, Anjo (JP)

(73) Assignees: Denso Corporation, Kariya (JP); Nippon Soken, Inc., Nishio (JP)

( * ) Notice: Subject to any disclaimer, the term of this patent is extended or adjusted under 35 U.S.C. 154(b) by 0 days.

(21) Appl. No.: 10/792,861

(22) Filed: Mar. 5, 2004

(65) Prior Publication Data

US 2004/0232971 A1   Nov. 25, 2004

(30) Foreign Application Priority Data

Mar. 6, 2003   (JP) .............................. 2003-060343

(51) Int. Cl.[7] ........................................ H03K 17/687
(52) U.S. Cl. ..................................... 327/434; 327/427
(58) Field of Search .............................. 327/423, 427, 327/434, 436

(56) References Cited

U.S. PATENT DOCUMENTS

| | | | |
|---|---|---|---|
| 4,423,341 A * | 12/1983 | Shelly | 327/112 |
| 4,461,966 A * | 7/1984 | Hebenstreit | 327/432 |
| 4,667,144 A * | 5/1987 | Jones et al. | 323/271 |
| 5,434,527 A * | 7/1995 | Antone | 327/391 |
| 5,469,089 A * | 11/1995 | Rothermel et al. | 327/56 |
| 5,939,927 A * | 8/1999 | Myers | 327/390 |
| 6,107,860 A * | 8/2000 | Vinciarelli | 327/427 |
| 6,496,047 B1 * | 12/2002 | Iskander et al. | 327/177 |
| 6,559,689 B1 * | 5/2003 | Clark | 327/97 |

FOREIGN PATENT DOCUMENTS

| JP | A 7-231250 | 8/1995 |
|---|---|---|
| JP | A 2003-244935 | 8/2003 |

* cited by examiner

*Primary Examiner*—Terry D. Cunningham
(74) *Attorney, Agent, or Firm*—Oliff & Berridge, PLC

(57) ABSTRACT

An electrically insulated type of switching element drive circuit supplies an AC voltage via a transformer to a control electrode drive circuit that controls a switching element, with the frequency or amplitude of the AC voltage being modulated in accordance with required on/off operation of the switching element, and with the output AC voltage from the transformer being rectified to obtain a DC supply voltage that is continuously supplied to the control electrode drive circuit. The control electrode drive circuit detects a condition of the AC voltage and controls the switching element accordingly.

5 Claims, 6 Drawing Sheets

RESONANCE FREQUENCY EQUATION:

$$f_o = \frac{1}{2\pi\sqrt{L_{eq}C_{eq}}}$$

$$L_{eq} = L2 + L1 \| LM$$

$$C_{eq} = C_o + C2 + C12$$

ELECTRICALLY INSULATED SWITCHING ELEMENT DRIVE CIRCUIT

BACKGROUND OF THE INVENTION

1. Field of Application

The present invention relates to an electrically insulated type of switching element drive circuit, i.e., whereby a switching element is driven by a control circuit that is insulated from a source of a control command signal which selectively designates setting of the switching element to the on (i.e., conducting) and off (i.e., non-conducting) states, with the control circuit operating in accordance with that control command signal.

2. Description of Prior Art

A DC-DC converter circuit or DC-AC inverter circuit generally is made up of an input circuit which produces a control signal and a drive circuit which supplies drive signals to the control electrodes of switching elements in accordance with the control signal, with the reference (ground) potential of the input circuit usually being different from that of the drive circuit. This is true for example of a drive circuit which drives a high-side switching element of a DC-AC inverter circuit, in which case the drive voltage applied to the control electrode of the high-side switching element must be produced with reference to an output voltage of the inverter circuit, i.e., which appears at the junction between the high-side switching element and a low-side switching element. Moreover in many cases, the reference potential of the drive circuit for a low-side switching element of such a DC-AC inverter circuit is also different from the reference potential of the input circuit.

In such a case, an electrically insulated type of switching element drive circuit is used, i.e., in which the circuit which actually drives the control electrodes of the switching elements is electrically insulated from the input circuit which supplies the control signal, so that the drive circuit and the control signal supplying circuit can have respectively different signal reference potentials. Various types of electrically insulated type of switching element drive circuit are known, such as an AC transformer electrically insulated type of switching element drive circuit or a pulse transformer electrically insulated type of switching element drive circuit.

For example as described in Japanese patent No. 7-231250, the output voltage from the secondary coil of a pulse transformer is directly applied to the gate electrode of a MOS transistor used as a switching element. As an example of an AC transformer electrically insulated type of switching element drive circuit, the AC voltage from the secondary coil of a transformer is rectified to supply power to a control electrode drive circuit of a switching element. A control signal is supplied to that control electrode drive circuit via a photo-coupler system, for example, to be amplified therein, and a resultant signal being applied to the control electrode of the switching element.

With such a prior art type of electrically insulated type of switching element drive circuit, using an AC transformer or pulse transformer, power can be transferred from a control circuit (i.e., input circuit) to be used in controlling a switching element. However it is necessary for such a circuit to use transistors which have high power-handling capability and the overall size of the circuit becomes excessive due to the size and weight of the transformer, so that the overall scale of such a circuit is large

SUMMARY OF THE INVENTION

It is an objective of the present invention to overcome the above problems of the prior art, by providing an electrically insulated type of switching element drive circuit which can have a simple circuit configuration, and can be compact and of light weight.

To achieve the above objective, according to a first aspect the invention provides an electrically insulated type of switching element drive circuit, for controlling on/off operation of a switching element in accordance with an externally supplied control command signal, with the switching element drive circuit having a control electrode drive circuit for supplying a drive signal to a control electrode of the switching element to thereby control the on/off operation based on the control command signal, and a power supply circuit for supplying electric power to operate the control electrode drive circuit. The power supply circuit also includes a transformer for supplying an AC voltage to the power supply circuit from a secondary side of the transformer, and an AC voltage output circuit for supplying the AC voltage to a primary side of the transformer, with command contents expressed by the control command signal being transmitted to the control electrode drive circuit from a source that is electrically insulated from the control command signal. With the present invention, such a circuit is characterized in that the AC voltage output circuit modulates a condition of the AC voltage in accordance with the control command signal such that command information is conveyed by the AC voltage, and in that the control electrode drive circuit comprises means for detecting the condition of the AC voltage and for altering the level of a drive voltage applied to the control electrode, based upon the results of detecting of the condition of the AC voltage.

As a result, the control electrode drive circuit is supplied with operating power via the transformer while at the same time the control command signal is also transmitted through the transformer to the control electrode drive circuit, without it being necessary to provide means such as a photo-coupler system for transmitting the command contents to the control electrode drive circuit. Hence, the overall circuit configuration can be greatly simplified by comparison with the prior art, so that a more compact electrically insulated type of switching element drive circuit can be realized.

In addition, since it is not necessary to use a pulse transformer, the manufacturing cost can be lower than in the case of an electrically insulated type of switching element drive circuit which incorporates such a transformer. Moreover, since the control electrode drive circuit can readily be configured to supply a high level of drive power, high-speed driving of the switching element can be achieved, i.e., with short-duration rise and fall times for the on/off switching operation.

Preferably with such an electrically insulated type of switching element drive circuit, the power supply circuit performs rectification and smoothing of the AC voltage received from the secondary side of the transformer to thereby obtain a DC voltage, and supplies the DC voltage to operate the control electrode drive circuit.

Moreover with such an electrically insulated type of switching element drive circuit, the AC voltage output circuit supplies the AC voltage to the power supply circuit via the transformer while the switching element is set in the off state.

In that way, an AC voltage continues to be supplied to the power supply circuit via the transformer when the switching element is in the off state, i.e., operating power is continuously supplied to the control electrode drive circuit. As a result, the switching element can be rapidly driven to the on state in response to the control command signal.

The condition that is modulated by the AC voltage output circuit in accordance with the control command signal can be the frequency of the AC voltage, or the amplitude of that AC voltage. Since changes in such a condition can readily be detected by the control electrode drive circuit, the overall circuit configuration can be simple.

Such an electrically insulated type of switching element drive circuit preferably includes a resonant circuit, for magnifying the amplitude of the AC voltage that is supplied to the control electrode drive circuit when that AC voltage has a specific frequency. The resonant circuit is preferably an integral part of a power transmission system that extends from the AC voltage output circuit to the power supply circuit. The AC voltage output circuit can be configured to respond to the on status of the control command signal (i.e., indicating that the switching element is to be set in the on state) for establishing a frequency of the AC voltage that is substantially identical to the resonance frequency of the resonant circuit, and to respond to the off status of the control command signal (indicating that the switching element is to be set in the off state) for establishing a frequency of the AC voltage that differs from the resonance frequency by a predetermined amount.

In that way, the power transfer efficiency of the transformer can be enhanced, and the control electrode drive circuit can more readily distinguish between the on and the off command statuses of the control command signal. The resonant circuit can be implemented as a simple LC resonant circuit.

The transformer of such an electrically insulated type of switching element drive circuit is preferably a coreless transformer, i.e., which does not incorporate a core formed of a magnetically permeable material. In addition one or more capacitors may be coupled to the transformer, such as to function in conjunction with the leakage inductance of the transformer as the resonant circuit, so that it becomes unnecessary to provide a resonant circuit formed of additional circuit elements.

In that way, since it becomes unnecessary to provide a transformer core formed of a magnetically permeable material, the overall weight can be substantially reduced. In addition, the large amount of leakage inductance of the coreless transformer becomes an advantage, since that leakage inductance can be used in combination with capacitors to constitute the resonant circuit. Hence, the power transfer efficiency of the transformer can be high, in spite of the large amount of leakage inductance. In addition, the incorporation of the leakage inductance of the transformer into the resonant circuit ensures that the emission of electrical noise from the transformer to other circuit elements (which would otherwise occur, due to the leakage inductance) can be greatly reduced.

If the coreless transformer is configured as an open type of magnetic circuit, it would be equally possible to form a part of the transformer core with magnetically permeable material, or a layer of magnetically permeable material.

Due to the fact that resonance is utilized, even if the turns ratio between the primary coil and the secondary coil of the transformer is set such as to maximize the efficiency of electromagnetic transmission (e.g., a turns ratio of 1:1), amplification of the AC voltage produced from the secondary coil can be achieved, due to the resonance effect.

Such a coreless transistor is preferably formed as a circuit substrate having a primary coil formed on a first face thereof, as a printed conductor having a spiral configuration, and a secondary coil formed on the opposite face of the circuit substrate, as a printed conductor that has a spiral configuration identical to the spiral configuration of the primary coil. It should be understood that the term "circuit substrate" is used in the description and claims of the present invention in a very general sense, so that the printed conductors may for example be formed directly as printed patterns of an electrically conducting material such as copper, on opposing main faces of a printed circuit board, or disposed on opposing sides of a layer of electrically insulating material that is formed on a face of a circuit board. In that way, the primary coil and secondary coil are separated only by the thickness of the circuit substrate or insulating layer. A coreless transformer can thereby be easily manufactured.

With such a configuration for the coreless transformer, it is preferably ensured that at least 80% of the printed conductor constituting the primary coil coincides in position with the printed conductor constituting the secondary coil, with respect to a direction at right angles to a main face of the circuit substrate. That is to say, the two coils are of substantially identical configuration and identical position on the circuit substrate, and differ in position only along the thickness direction of the circuit substrate. It can thereby be ensured that the electromagnetic coupling between respective turns of the primary coil and the secondary coil of the transformer can be maximized, thereby enabling the power transfer efficiency of the transformer to be enhanced.

DESCRIPTION OF PREFERRED EMBODIMENTS

Figure 1:
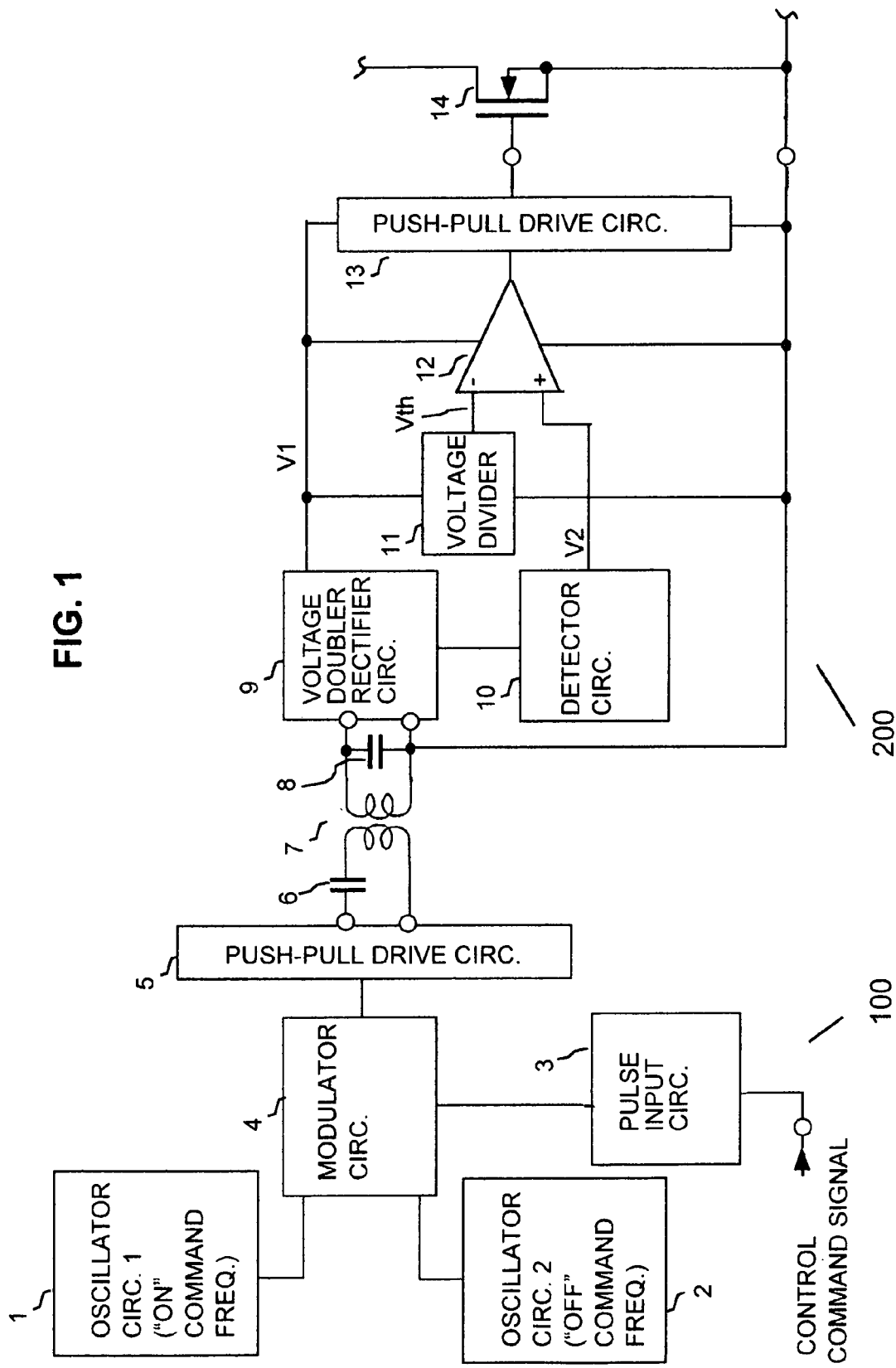
FIG. 1 is a circuit diagram showing the overall configuration of an embodiment of an electrically insulated type of switching element drive circuit.

A preferred embodiment of an electrically insulated type of switching element drive circuit will be described referring to FIG. 1. In FIG. 1, numeral 1 denotes an "on" command-use oscillator circuit which is a sine-wave oscillator whose oscillation frequency corresponds to an on command status of a control command signal, indicating that a controlled switching element is to be set in the on state as described hereinafter. The oscillator signal (i.e., AC voltage, used as a carrier) from the "on" command-use oscillator circuit 1 is supplied to a modulator circuit 4, together with the oscillation signal from an "off" command-use oscillator circuit 2 which also is a sine-wave oscillator. The oscillation frequency of the "off" command-use oscillator circuit corresponds to an off command status of the control command signal, indicating that the controlled switching element is to be set in the off state. The control command signal is supplied from an external source to a pulse input circuit 3 as shown, which generates an output pulse signal in accordance with the control command signal, with that pulse signal being inputted to the modulator circuit 4. However if the control command signal is appropriate, e.g., is a PWM (pulse width modulation) signal of appropriate waveform, then it may be possible to input the control command signal directly to the modulator circuit 4, with the pulse input circuit 3 being omitted.

The modulator circuit 4 selects the oscillation signal from the "on" command-use oscillator circuit 1 to be outputted therefrom when the control command signal is in the on status, and selects the oscillation signal from the "off" command-use oscillator circuit 2 to be outputted therefrom when the control command signal is in the off status. The output produced from the modulator circuit 4 is supplied to a push-pull amplifier 5, and the resultant output from the push-pull amplifier 5 will be referred to simply as the "AC voltage". As will be understood this is a pulse frequency-modulated signal, whose frequency is switched between that of the "on" command-use oscillator circuit 1 and that of the "off" command-use oscillator circuit 2 in accordance with the status of the control command signal.

The modulator circuit 4 can be configured as an analog multiplexer circuit, which selects either the output signal from the "on" command-use oscillator circuit 1 or the output signal from the "off" command-use oscillation circuit 2 based on the pulse signal supplied from the pulse input circuit 3.

It should be noted that it would be equally possible to utilize rectangular-wave oscillator circuits rather than sine-wave oscillator circuits as the oscillator circuits 1 and 2.

Any of various well-known types of amplifier circuit could be used as the push-pull amplifier 5. With a specific configuration of this embodiment, described hereinafter, a complementary emitter-follower type of push-pull drive circuit is used as the push-pull amplifier 5. However it would be equally possible to use a CMOS inverter circuit for that purpose, for example.

The AC voltage produced from the push-pull amplifier 5 is transferred through a primary-side capacitor 6 to the primary coil of a coreless transformer 7, which in this embodiment is a coreless transformer.

The "on" command-use oscillator circuit 1, "off" command-use oscillator circuit 2, modulator circuit 4 and push-pull amplifier 5 in combination constitute an AC voltage output circuit 100 of this embodiment.

Figure 2:
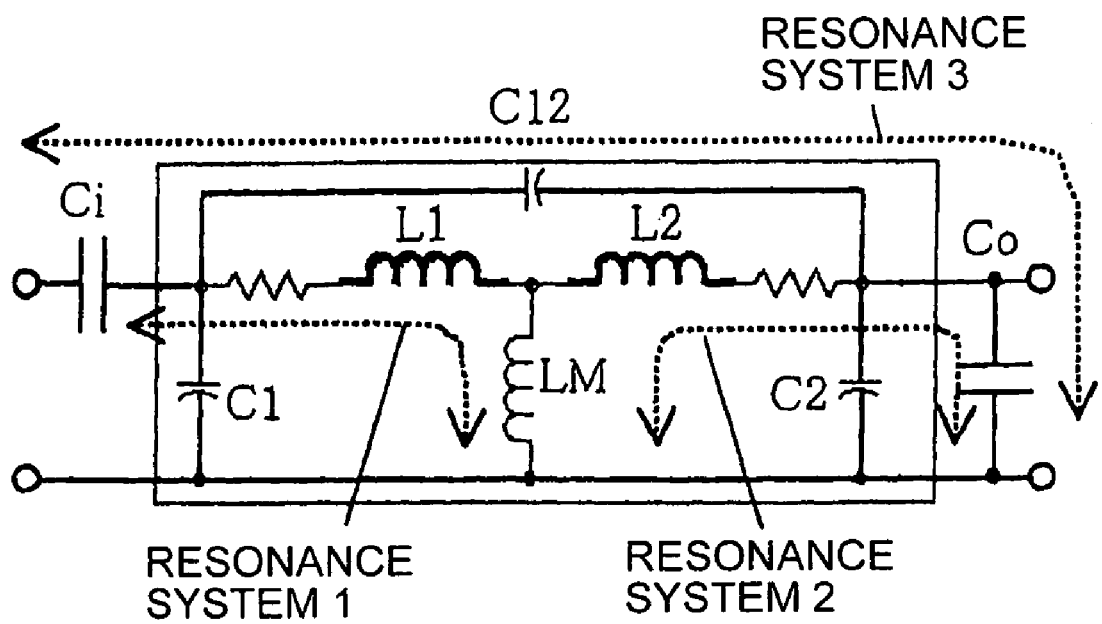
FIG. 2 is an equivalent circuit diagram of a coreless transformer used in the embodiment of FIG. 1.

A secondary-side capacitor 8 is connected across the secondary coil of the coreless transformer 7 as shown, and the primary-side capacitor 6 and secondary-side capacitor 8' function in conjunction with the leakage inductance of the coreless transformer 7 to constitute a resonant circuit, whose resonance frequency is identical to the oscillation frequency of the "on" command-use oscillator circuit 1. FIG. 2 shows the equivalent circuit of this resonant circuit, and an equation which expresses the resonance frequency of that circuit. A primary-side resonance system is made up of the leakage inductance L1 of the primary side of the coreless transformer 7 and the capacitance C1 of the primary-side capacitor 6, i.e., with this being a series resonance system. A secondary-side resonance system is made up of the leakage inductance of the secondary side of the coreless transformer 7 and the capacitance value C0 of the secondary-side capacitor 8, with this also being a series resonant circuit, whose output voltage appears across the capacitor 8. Such types of resonant circuit are well known, so that detailed description will be omitted. However it should be noted that since the coreless transformer 7 has a large amount of stray capacitance, all or part of the secondary-side capacitor 8 could be constituted by that stray capacitance.

The essential point is that the oscillation frequency of the "off" command-use oscillator circuit 2 differs from that of the "on" command-use oscillator circuit 1 by a predetermined amount. With this embodiment, the oscillation frequency of the "off" command-use oscillator circuit 2 is made lower than that of the "on" command-use oscillator circuit 1 by that predetermined amount. As a result, when the oscillation output from the "off" command-use oscillator circuit 2 is selected to be outputted from the modulator circuit 4, the output voltage from the secondary coil of the coreless transformer 7 will be of smaller amplitude than when the output from the "on" command-use oscillator circuit 1 is selected, since the oscillation frequency of the "on" command-use oscillator circuit 1 is the resonance frequency of the above-described resonant circuit. The ratio of these two output voltage amplitudes from the secondary coil of the coreless transformer 7 is a predetermined value.

The output voltage from the secondary coil of the coreless transformer 7, i.e., the AC voltage that appears across the secondary-side capacitor 8, is subjected to voltage-doubling rectification by a voltage-doubler rectifier circuit 9, and the resultant DC voltage is smoothed by a capacitor within the voltage-doubler rectifier circuit 9. In addition, the smoothed DC voltage may be stabilized by using a voltage stabilizer diode. A resultant smoothed DC power supply voltage designated as V1 in FIG. 1 is thereby obtained, which is substantially constant in value. The power supply voltage V1 is supplied to operate a comparator 12 and a push-pull drive circuit 13, and is also applied across a voltage divider 11.

It may be possible to omit the use of a voltage stabilizer diode for producing the power supply voltage V1, i.e., it may be possible to achieve satisfactory operation even if there is some residual ripple component in that power supply voltage.

The voltage divider 11 is a resistive voltage divider which performs voltage division of the DC power supply voltage V1. The voltage-divided output from the voltage divider 11 is applied to one input terminal of a comparator 12. An (unsmoothed) rectified voltage produced within the voltage-doubler rectifier circuit 9 is subjected to half-wave rectification by a detector circuit 10, to obtain a detection voltage designated as V2. The detection voltage V2 is applied to the other input of the comparator 12, to be compared with the output voltage Vth from the voltage divider 11. The output voltage from the comparator 12 is applied through a push-pull drive circuit 13 to the gate electrode of a MOS-FET 14, which is the switching element of this embodiment.

The detector circuit 10, voltage divider 11, comparator 12 and push-pull drive circuit 13, in combination, constitute an control electrode drive circuit 200 of this embodiment.

If the controlled switching element is an n-channel MOS-FET (metal-oxide semiconductor field effect transistor) as is the MOS-FET 14 of this embodiment, then the switching element is set in the on (i.e., conducting) state when the gate electrode potential is made sufficiently positive with respect to the source electrode potential. Hence, the detection voltage V2 from the detector circuit 10 and the output voltage Vth from the voltage divider 11 are applied to the positive input terminal and to the negative input terminal of the comparator 12, respectively, in that case.

The output voltage from the comparator 12 is applied through a push-pull drive circuit 13 to the gate electrode of the MOS-FET 14.

It can thus be understood that when the oscillation frequency of the "on" command-use oscillator circuit 1 is selected (in accordance with the status of the control command signal) for the AC voltage that is supplied to the primary coil of the coreless transformer 7, that AC voltage is amplified by the resonant circuit, causing the level of the detection voltage V2 to exceed Vth, so that a positive voltage is applied from the push-pull drive circuit 13 to the gate electrode of the MOS-FET 14, setting the MOS-FET 14 in the on state. Otherwise, when the oscillation frequency of the "on" command-use oscillator circuit 1 is selected, so that no amplification is effected by the resonant circuit, the detection voltage V2 will be below the threshold value Vth, so that the gate electrode and source of the MOS-FET 14 are held at substantially the same potential, and the MOS-FET 14 is held in the off (i.e., non-conducting) state.

It is a basic feature of the present invention, and of this embodiment, that the DC supply voltage V1 from the voltage-doubler rectifier circuit 9 continues to be supplied to the control electrode drive circuit 200 while the MOS-FET 14 is in the off state. As a result, each time a transition occurs from the oscillation frequency of the "off" command-use oscillator circuit 2 being selected to the oscillation frequency of the "on" command-use oscillator circuit 1 being selected, a drive voltage can be rapidly supplied from the push-pull drive circuit 13 to the gate electrode of the MOS-FET 14, so that the MOS-FET 14 can be rapidly driven to the on state.

Figure 3A:
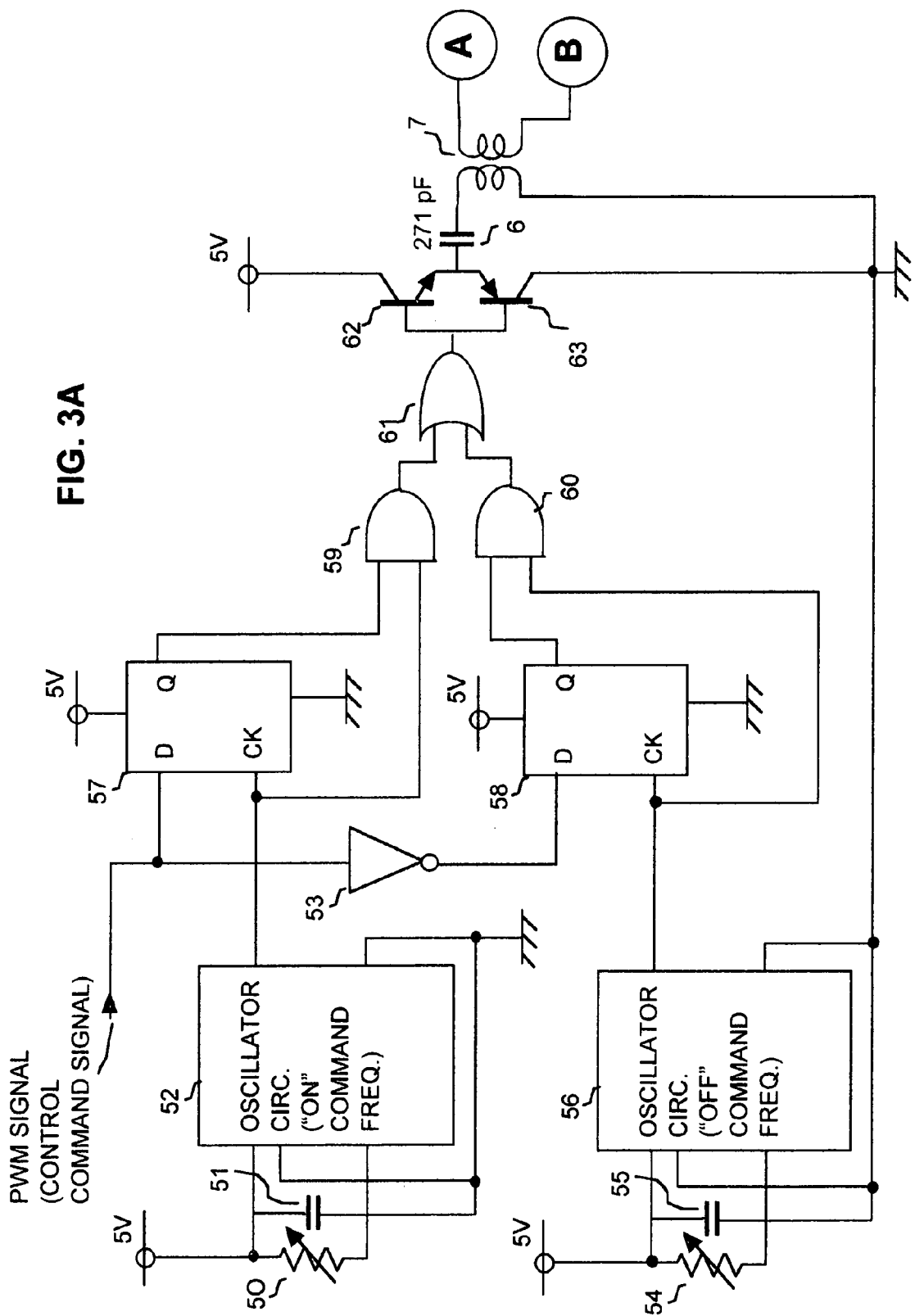
FIGS. 3A, 3B constitute a circuit diagram of a specific configuration for the above embodiment.
Figure 3B:
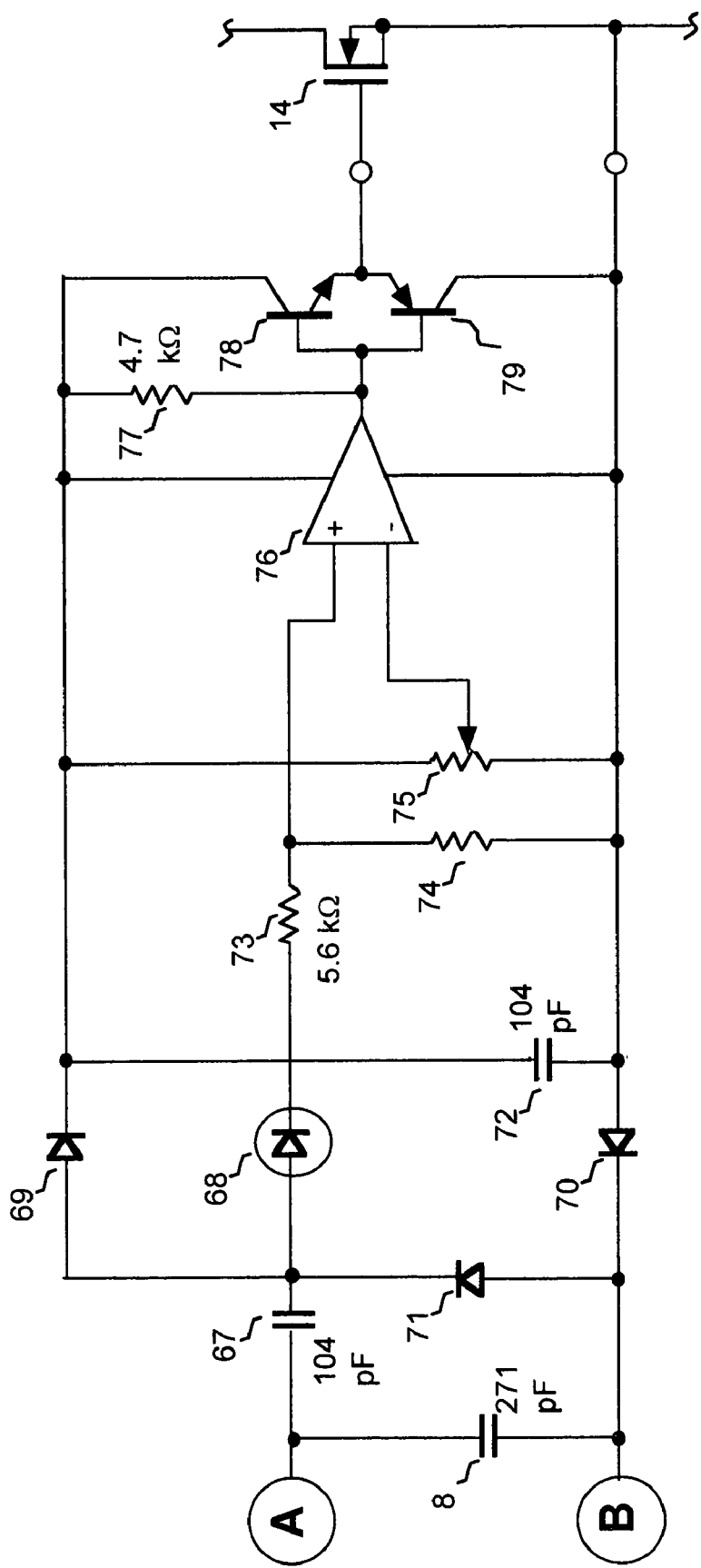

FIGS. 3A, 3B constitute a circuit diagram of an example of a specific configuration for the embodiment shown in FIG. 1. Here, a first oscillator circuit 52 (which can be formed as an integrated circuit) in conjunction with a capacitor 51 and adjustable resistor 50 constitute the "on" command-use oscillator circuit 1 of FIG. 1, while a second oscillator circuit 56 in conjunction with a capacitor 55 and adjustable resistor 54 constitute the "off" command-use oscillator circuit 2 of FIG. 1. An inverter 53, data-type flip-flops (D-FFs) 57, 58, AND gates 59, 60 and OR gate 61 are connected to constitute the modulator circuit 4 of FIG. 1. Transistors 62, 63 are connected to constitute the push-pull amplifier 5 of FIG. 1. A capacitor 67 and diodes 69, 70, 71 in conjunction with a smoothing capacitor 72 constitute the voltage-doubler rectifier circuit 9 of FIG. 1. A diode 68 in conjunction with resistors 73, 75 constitute the detector circuit 10 of FIG. 1. A potentiometer 75 constitutes the voltage divider 11 of FIG. 1. Transistors 78, 79 in conjunction with a resistor 77 constitute the push-pull drive circuit 13 of FIG. 1. With this example, the externally supplied control command signal is a PWM signal which is suitable for being directly supplied to the modulator circuit, so that the pulse input circuit 3 of FIG. 1 is omitted.

Figure 4:
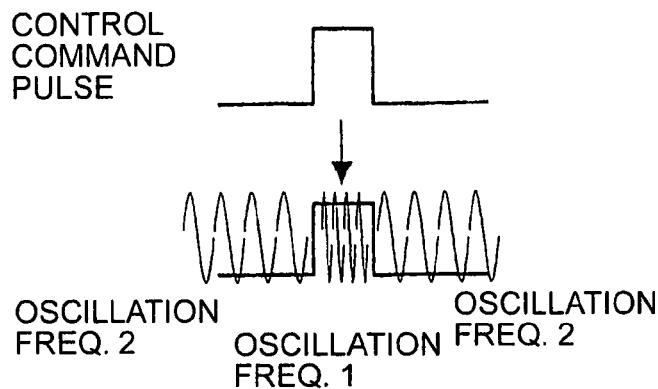
FIG. 4 is a waveform diagram for illustrating frequency modulation that is applied with the above embodiment.
Figure 5:
FIG. 5 is a waveform diagram illustrating relationships between a detection voltage, a detection threshold value of voltage and a DC power supply voltage of a control electrode drive circuit, with the above embodiment.
Figure 6:
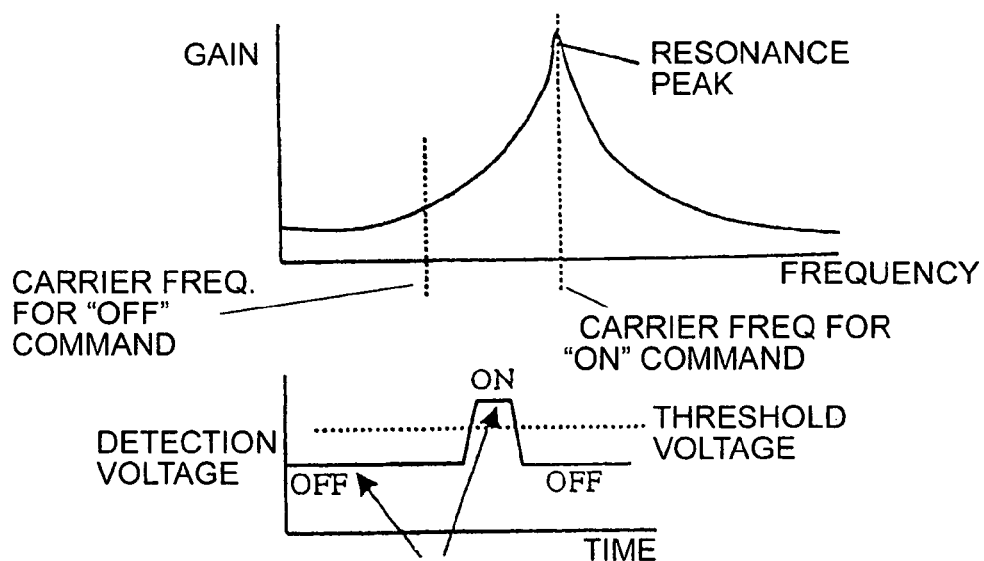
FIG. 6 is a graph showing a gain/frequency characteristic of a resonant circuit used in the above embodiment.

FIG. 4 is a waveform diagram illustrating the relationship between selection of the oscillation frequency of the "on" command-use oscillator circuit 1 (designated as oscillation frequency 1) and that of the "off" command-use oscillator circuit 2 (designated as oscillation frequency 2) in accordance with the level of the control command signal. FIG. 5 is a waveform diagram showing an example of relationships between the threshold voltage Vth from the comparator 12, the detection voltage V2 from the detector circuit 10 and the power supply voltage V1 from the voltage-doubler rectifier circuit 9. FIG. 6 illustrates the relationships between the oscillation frequency that is selected to set the MOS-FET 14 in the off state (i.e., the oscillation frequency 2), the oscillation frequency that is selected to set the MOS-FET 14 in the on state (i.e., the oscillation frequency 1) and the gain/frequency characteristic of the aforementioned resonant circuit that is constituted by the leakage inductance of the coreless transformer 7 in conjunction with the capacitors 6 and 8. FIG. 6 also illustrates the relationship between the levels of the detection voltage V2 and the on and off states of the MOS-FET 14. As described above, the MOS-FET 14 is set in the on state when the detection voltage V2 exceeds the threshold value Vth from the voltage divider 11, and is otherwise held in the off state.

The above embodiment has been described with respect to a specific configuration, however it will be apparent that various other configurations could be envisaged, based on the principles described above. The essential basic feature is that the voltage-doubler rectifier circuit 9 supplies electrical power to the control electrode drive circuit 200 not only while the MOS-FET 14 is set in the on state but also when it is in the off state.

It may be possible to supply a lower level of DC supply voltage V1 to the control electrode drive circuit 200 while the MOS-FET 14 is in the off state, by comparison with that of the on state, to a certain extent. Thus an alternative configuration from that of the above embodiment could be envisaged, in which amplitude modulation rather than frequency modulation is used to transmit the control command signal via the coreless transformer 7 to the control electrode drive circuit, i.e., with the amplitude of the AC voltage produced from the push-pull amplifier 5 being reduced when the MOS-FET 14 is to be set in the off state. In that case, only a single oscillator circuit would be required, and a detector circuit which detects the amplitude of the AC voltage supplied from the coreless transformer 7 could be used to obtain the detection voltage V2, in place of the detector circuit 10 of the above embodiment. It will be apparent that in other respects, the operation and the advantages obtained by such an alternative configuration would be similar to those described for the embodiment of FIG. 1, so long as it is ensured that DC power is supplied to the control electrode drive circuit by rectification of the AC voltage from the secondary coil of the transformer, both when the switching element is set in the on state and when it is set in the off state.

Furthermore, rectangular-waveform oscillator circuits rather than sinusoidal-wave oscillator circuits could be utilized in the AC voltage output circuit 100, in which case the fundamental frequency of oscillation of the oscillator circuit corresponding to the "on" command-use oscillator circuit 1 of FIG. 1 should be made identical to the resonant frequency of the resonant circuit.

It should also be noted that it would be equally possible to use a full-wave rectifier circuit or half-wave rectifier circuit in place of the voltage-doubling rectifier circuit 9 of the above embodiment.

Moreover with the above embodiment, the resonance frequency of the resonant circuit is made equal to the oscillation frequency of the "on" command-use oscillator circuit 1. However since in practice the AC voltage that is supplied from the push-pull amplifier 5 to the coreless transformer 7 may contain large amounts of third-harmonic component, it may be preferable to make the resonance frequency of the resonant circuit three times the fundamental frequency of the "on" command-use oscillator circuit 1.

Figure 7:
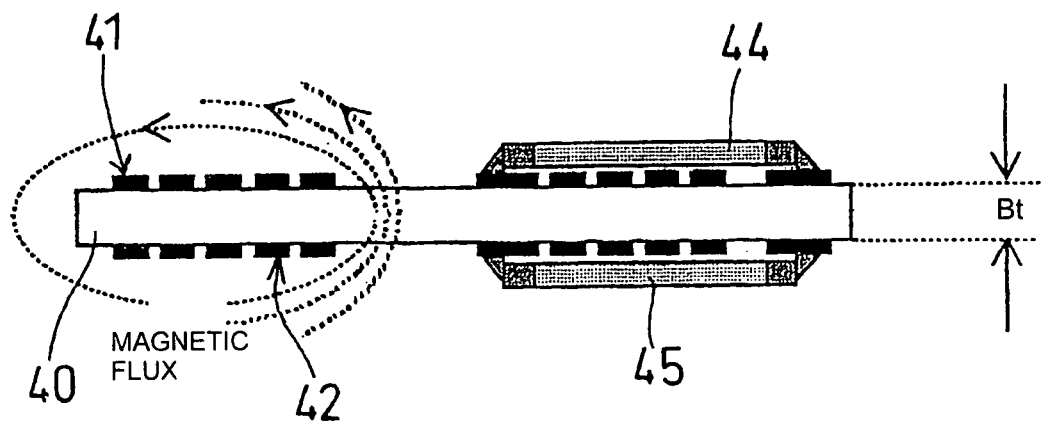
FIG. 7 is a cross-sectional view of a specific configuration of a coreless transformer.
Figure 8:
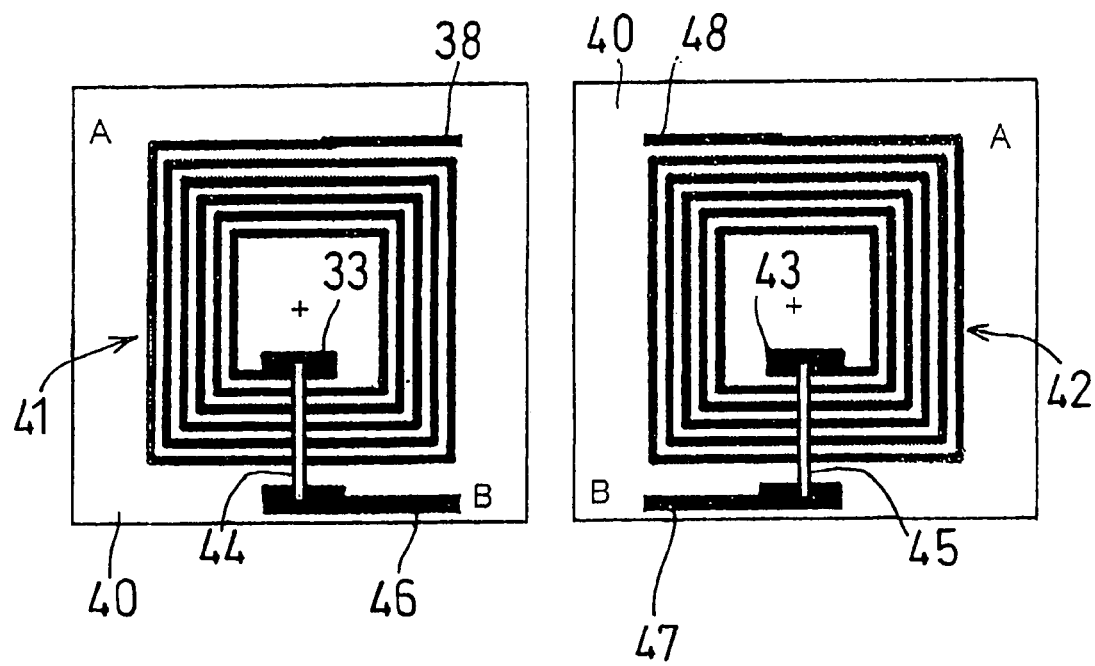
FIG. 8 shows conductor patterns formed on opposing faces of a circuit substrate, in the coreless transformer of FIG. 7.

A specific configuration for a coreless transformer used as the coreless transformer 7 of the above embodiment will be described referring to FIGS. 7 and 8. FIG. 7 is a cross-sectional view of the coreless transformer (with a conceptual illustration of magnetic field coupling between the primary coil and secondary coil shown at the left side of FIG. 7), taken through a plane that is perpendicular to the main faces of the circuit substrate 40. The right and left sides of FIG. 8 respectively show a plan view of a primary coil 41 formed on an upper face of the circuit substrate 40 and a plan view of a secondary coil 42 formed on a lower face of the circuit substrate 40 (i.e., as viewed from below that lower face). In FIG. 8, the letters A in the right-side and left-side diagrams indicate the same corner of the circuit substrate 40, while the letters B similarly indicate an identical corner.

It should be understood that the circuit substrate is not necessarily limited to being a printed circuit board, but might for example be a layer of electrically insulating material that is formed on a printed circuit board (for example, with the secondary coil 42 being printed directly on the circuit board and with the primary coil 41 being printed on the insulating layer). Alternatively, the primary coil 41 and secondary coil 42 could be successively formed patterns within a multi-layer integrated circuit, separated by a layer of electrically insulating material.

With this example, the primary coil 41 and the secondary coil 42 are each of spiral shape and are formed by printing respective patterns of an electrically conductive material such as a thin layer of copper, upon opposing main faces of the circuit substrate 40, with the patterns being mutually identical (other than in being mirror images of one another) as shown, so that the patterns are separated by the thickness Bt of the circuit substrate. The inner end of the primary coil 41 is connected to an inner terminal pad 33 that is formed on the same face of the circuit substrate 40 as the primary coil 41, while the inner end of the secondary coil 42 is similarly connected to an inner terminal pad 43. The inner terminal pad 33 is connected to an outer terminal pad 46 that is formed on the same face of the circuit substrate 40 as the primary coil 41, via a connecting lead 44, while the inner terminal pad 43 is connected to an outer terminal pad 47 that is formed on the same face of the circuit substrate 40 as the secondary coil 42, via a connecting lead 45.

The connecting leads 44, 45 are electrically insulated from the conductors of the corresponding coils 41, 42, e.g., by a layer of electrically insulating material such as a resin material that is formed over the corresponding coil. The primary coil 41 and secondary coil 42 have respective outer terminals 38, 48.

As shown, the spiral patterns constituting the primary coil and secondary coil are located on respective opposite main faces of the circuit substrate such that each part of one pattern is located substantially directly opposite a corresponding part of the other pattern.

Although a specific configuration is shown for the coreless transformer of FIGS. 7, 8, e.g., with a square shape of each spiral-configuration coil, various other configurations could be envisaged. The essential conditions are:

(a) the primary coil and secondary coil are formed on opposite faces of a circuit substrate as identical spiral patterns (other than that each is formed as a mirror image of the other) with each having the same number of turns, (b) the two patterns are located at identical positions and with identical orientations (with respect to a direction at right angles to a main face of the circuit substrate) so that the respective conductors of the primary coil and secondary coil substantially entirely overlap.

If these conditions are satisfied, while in addition the two outer terminal pads 46, 47 are similarly formed and positioned such as to mutually overlap, as shown in FIG. 8, then excellent electromagnetic coupling between the primary coil and secondary coil can be achieved, in spite of the fact that this is a coreless transformer. Preferably, at least 80% of the conductor pattern constituting the primary coil should overlap the conductor pattern constituting the secondary coil, as seen along the aforementioned direction at right angles to a main face of the circuit substrate.

It can be understood that connections to the primary coil and secondary coil can readily be performed by means of the outer terminals 38, 48 and the outer terminal pads 46, 47.

Furthermore due to the fact that the primary coil and secondary coil are formed on opposite faces of the circuit substrate, i.e., are separated by the thickness of that circuit substrate, a high degree of electrical insulation can be achieved between these coils of the transformer, by forming the circuit substrate of a suitable electrically insulating material having an appropriate thickness.

As mentioned hereinabove, it would be possible to design the voltage-doubler rectifier circuit 9 of the embodiment of FIG. 1 to perform full-wave DC rectification rather than voltage-doubling rectification or half-wave rectification. In that case it would be necessary to provide two identical secondary coils in the coreless transformer 7. This can be achieved by forming the two secondary coils as two enmeshed identical spiral patterns on the same face of the circuit substrate, and with the primary coil located within the outer periphery of the two secondary coils, on the opposite face of the circuit substrate from the two secondary coils.

Furthermore if it is required to increase the numbers of turns in the coils of the coreless transformer 7, this can be achieved by using a multi-layer circuit substrate, with respective coils formed on the layers, each stacked one above the other, and with the coils being appropriately interconnected by through-hole connections.

Moreover it would be possible to modify the example of FIGS. 7, 8 to provide through-hole connections for connecting the outer terminal 48 and the outer terminal pad 47 to terminal pads that are formed on the same face of the circuit substrate 40 as the primary coil 41.

It should be further noted that although the embodiment of FIG. 1 has been described for the case of controlling a switching element that is an n-channel MOS-FET, it will be apparent that such an electrically insulated type of switching element drive circuit can be adapted to control various other types of switching element.

What is claimed is:

1. An electrically insulated type of switching element drive circuit, for controlling on/off operation of a switching element in accordance with an externally supplied control command signal, said switching element drive circuit comprising:

a control electrode drive circuit for supplying a drive signal to a control electrode of said switching element, to control said on/off operation based on said control command signal;

a power supply circuit for supplying electric power to operate said control electrode drive circuit;

a transformer for supplying an AC voltage to said power supply circuit from a secondary side of said transformer, said power supply circuit performing rectification and smoothing of said AC voltage from said secondary side of said transformer to thereby obtain a DC voltage, and supplying said DC voltage to operate said control electrode drive circuit; and an AC voltage output circuit for supplying said AC voltage to a primary side of said transformer;

a power transmission system that extends from said AC voltage output circuit to said power supply circuit comprises a resonant circuit, wherein:

said control electrode drive circuit comprises means for detecting a condition of said AC voltage relating to a frequency of said AC voltage and for altering a magnitude of a drive voltage applied to said control electrode, based upon results of said detection of said condition of said AC voltage, said AC voltage output circuit is responsive to an on status of said control command signal, indicating that said switching element is to be set in said on state, for establishing a frequency of said AC voltage that is substantially identical to a resonance frequency of said resonant circuit, and said AC voltage output circuit is responsive to an off status of said control command signal, indicating that said switching element is to be set in said off state, for establishing a frequency of said AC voltage that differs from said resonance frequency by a predetermined amount.

2. An electrically insulated type of switching element drive circuit according to claim 1, wherein said transformer comprises a coreless transformer, further comprising at least one capacitor coupled to said transformer for functioning in conjunction with an inductance of said transformer to constitute said resonant circuit.

3. An electrically insulated type of switching element drive circuit according to claim 2, wherein said transformer configured as a coreless transistor comprises a circuit substrate formed of an electrically insulating material, a primary coil formed as a pattern of electrically conductive material on a first face of said circuit substrate, having a spiral configuration, and a secondary coil formed as a pattern of electrically conductive material on a second face of said circuit substrate, opposite to said first face, having a spiral configuration corresponding to said spiral configuration of said primary coil, with each part of said pattern of the secondary coil being located substantially directly opposite a corresponding part of said pattern of the primary coil.

4. An electrically insulated type of switching element drive circuit according to claim 3 wherein said circuit substrate is a printed circuit board and wherein each of said primary coil and secondary coil is formed as a printed pattern of a metallic material, with said patterns formed on opposing main faces of said printed circuit board.

5. An electrically insulated type of switching element drive circuit according to claim 3 wherein at least 80% of said pattern constituting said primary coil coincides in position with said pattern constituting said secondary coil, with respect to a direction at right angles to said first and second faces of said circuit substrate.

* * * * *